United States Patent [19]

Cheng

[11] Patent Number: 5,495,178
[45] Date of Patent: Feb. 27, 1996

[54] METHOD AND APPARATUS FOR MEASURING FILM THICKNESS

[76] Inventor: David Cheng, 711 Hibernia Ct., Sunnyvale, Calif. 94087

[21] Appl. No.: 974,853

[22] Filed: Nov. 10, 1992

[51] Int. Cl.$^6$ ............................................. G01R 31/02
[52] U.S. Cl. .................................. 324/716; 324/713
[58] Field of Search ............................ 324/713, 715, 324/716, 718–719, 537

[56] References Cited

U.S. PATENT DOCUMENTS

| | | | |
|---|---|---|---|
| 2,659,861 | 11/1953 | Branson | 324/716 |
| 2,659,862 | 11/1953 | Branson | 324/716 |
| 3,601,693 | 8/1971 | Zorentzen | 324/715 |
| 3,676,775 | 7/1972 | Dupaock et al. | 324/64 |
| 3,735,254 | 5/1973 | Severin | 324/716 |
| 4,048,558 | 9/1977 | Goodman | 324/715 |
| 4,267,506 | 5/1981 | Shiell . | |
| 4,335,350 | 6/1982 | Chen | 324/64 |
| 4,546,318 | 10/1985 | Bowden | 324/715 |
| 4,667,149 | 5/1987 | Cohen et al. | 324/64 |
| 4,703,252 | 10/1987 | Perloff et al. | 324/62 |
| 4,706,015 | 11/1987 | Chen | 324/64 |
| 4,755,746 | 7/1988 | Mallory et al. | 324/158 |
| 4,758,777 | 7/1988 | Bossard et al. . | |
| 4,907,931 | 5/1990 | Mallory et al. | 414/225 |
| 4,989,154 | 1/1991 | Yamashita et al. | 364/482 |
| 5,006,809 | 4/1991 | Mang et al. | 324/715 |
| 5,144,253 | 9/1992 | Blanchard | 324/715 |

FOREIGN PATENT DOCUMENTS 2027212A  2/1980  United Kingdom ............... 324/716

*Primary Examiner*—Maura K. Regan
*Attorney, Agent, or Firm*—Hickman & Beyer

[57] ABSTRACT

A method and apparatus for measuring film thickness and sheet resistance. A four-point probe engages the surface of a film, and a measuring apparatus outputs a voltage waveform which induces a current in the outer probes of the four point probe and through the surface of the film. The two inner probes measure a voltage in the film created by the current. The current created by the voltage waveform and the voltage created across the inner probes are measured for each voltage level of the waveform. A sheet resistance of the film is calculated by taking a least square fit of the measured current and voltage and calculating the slope of the least square line fit. The sheet resistance is proportional to the slope of the least square line. The thickness of the film is calculated by dividing the film resistivity by the calculated sheet resistance.

25 Claims, 5 Drawing Sheets

METHOD AND APPARATUS FOR MEASURING FILM THICKNESS

BACKGROUND OF THE INVENTION

1. Field of the Invention

This invention relates to the measurement of film thickness, and more particularly to the measurement of film thickness by measuring the sheet resistance of a conductive film.

2. Background of the Related Art

Films of various materials are used widely in the manufacture of products. For example, conductive films are often applied to semiconductor wafers as part of a process for manufacturing integrated circuit chips. Many integrated circuits have devices with submicron geometries, requiring very uniform film thicknesses. It is therefore desirable to have a means for measuring film thickness to ensure uniform film deposition.

Testing of film thickness is often done using a test probe assembly that contacts a film 14 formed on a wafer 15, as shown in FIG. 1. The probe assembly 10 usually includes four linearly arranged probes 12a–d, where the two outer probes 12a and 12d direct a constant current I through the film 14 and the two inner probes 12b and 12c read the voltage drop created across the film by the current I on a meter 16. Alternatively, probes 12a and 12c can direct the current I and probes 12b and 12d can read the voltage drop. The constant current I is generated by a current source 18. Following the voltage measurement, the sheet resistance can be calculated from the relationship:

$$R = 4.562 \frac{V}{I}$$

where V is the voltage measured by the two inner probes and I is the current flowing through the film. This formula assumes that all four probes of the probe assembly 10 are equally spaced apart. The film thickness can be calculated from the relationship:

$$\text{Thickness(cm)} = \frac{\rho}{R_{sheet}}$$

where $\rho$ is the resistivity of the film in ohm-cm, and $R_{sheet}$ is the measured sheet resistance.

Four point probe measurement systems have been improved over the basic apparatus described above. In U.S. Pat. No. 3,676,775 by A. Dupnock, a method for measuring the resistivity of an epitaxial semiconductor layer is described in which at least two-spaced high conductivity diffused regions are formed in the base wafer prior to deposition of the epitaxial layer, and the four point probe is is located directly over the high conductivity regions. In U.S. Pat. No. 4,989,154 by Yamashita et al., a method and apparatus for measuring resistivity using a four-point probe is described in which a correction coefficient is calculated from shape and position information of the wafer and multiplied by the measured resistance value. The Yamashita et al. apparatus includes a computer controller that receives the four point probe measurements through an analog-to-digital (A/D) converter. In U.S. Pat. No. 4,335,350 by J. Chen, an apparatus utilizing two probes is described, in which a four point probe is engaged with one surface of a wafer, and another probe is engaged with the other surface in order to measure leakage current from the first probe. Finally, in U.S. Pat. No. 4,703,252 by Perloff et al., an apparatus and method for testing the sheet resistance of a wafer is described in which multiple test readings are taken by a four point probe at predetermined test locations on the wafer.

While the prior art four point probe apparatus have been successful in measuring the sheet resistance and film thickness of wafers, they tend to exhibit some undesirable characteristics. For example, the prior art uses constant current sources to provide the current through the film. Current sources are expensive and slow to stabilize, often requiring five seconds or so to stabilize for each measurement. This stabilization delay is undesirable for production environments, where fast measurements are desired.

A further problem with the prior art four-point probe apparatus is the presence of offsets and drifts in the current level of the current source. Inaccurate sheet resistance and film thickness values can result from this problem.

A different problem in the prior art is the presence of hysteresis and magnetic effects that occur when different current levels are tested in the wafer. These effects appear when a large jump in current level occurs and can substantially alter a measurement enough so that its accuracy cannot be relied upon.

What is needed is an apparatus and method that will quickly test a wafer for resistivity and thickness so that many measurements of a wafer's surface can be taken and more wafers can be tested in a given amount of time. What is further needed is an apparatus and method that will eliminate the hysteresis and magnetic effects of taking a measurement with a probe so as to increase the accuracy of the measurements.

SUMMARY OF INVENTION

The present invention addresses the problems in the prior art by providing a method and apparatus to measure film thickness by coupling a variable voltage source to the outer probes of a probe assembly to provide a variable current through the film. The variable current does not need to stabilize before measurement of film thickness. Probe measurements are taken at many different voltage levels to provide a more accurate overall sheet resistance measurement. These improvements allow measurements to be taken in a shorter amount of time with more accuracy.

The apparatus comprises a variable voltage source coupled to the outer probes of a four point probe assembly by a sense resistor. The four point probe assembly engages the surface of a conductive film on a substrate so that a current flows through the surface of the film between the two outer probes. The voltage source preferably includes a digital computer connected to a digital-to-analog converter (DAC) which produces a sawtooth voltage waveform. This sawtooth waveform is then amplified prior to being applied to the four point probe.

The current flowing through the film is measured by measuring the voltage across the sense resistor and applying Ohm's law (I=V/R). Both the voltage across the sense resistor and the voltage between the inner probes of the four point probe are measured using variable gain differential amplifiers. The differential amplifiers send their respective outputs to analog-to-digital converters (ADCs), which provide digital signals to the digital computer. The computer can then calculate the sheet resistance in the surface of the film from the ratio of the current to the voltage across the inner probes. A sheet resistance is preferably measured for a number of input voltage levels in the sawtooth-shaped waveform. For each sheet resistance measurement taken, a film thickness is calculated using the known resistivity of the film material.

The present invention has the advantage of measuring I and V rather than assuming I for the sheet resistance measurements.

The present invention also has the advantage of measuring the sheet resistance of the film using a least square fit of the voltage measurements and calculating the slope of the least square line. The sheet resistance is proportional to the slope of this line. Since a slope is measured, the resistance measurement is not sensitive to drifts and offsets in the voltage source or in the entire electronic system.

The present invention also has the advantage of taking many measurements at different current levels in a small mount of time. With many more measurements, the accuracy of the resistance measurement is greatly increased. Also, since the voltage source generates a voltage waveform instead of a constant current, the invention does not have a delay time that is required for a current source to stabilize. As a result, many more measurements can be taken in a given amount of time, which speeds up the entire process and allows more substrates to be tested. Finally, the measurements are taken with a sawtooth-shaped input voltage waveform, which is continuous and has no large current jumps; this waveform shape tends to eliminate magnetic effects of the film and thus degausses the measurement.

These and other advantages of the present invention will become apparent to those skilled in the art after reading the following descriptions and studying the various figures of the drawings.

DETAILED DESCRIPTION OF THE PREFERRED EMBODIMENTS

Figure 1:
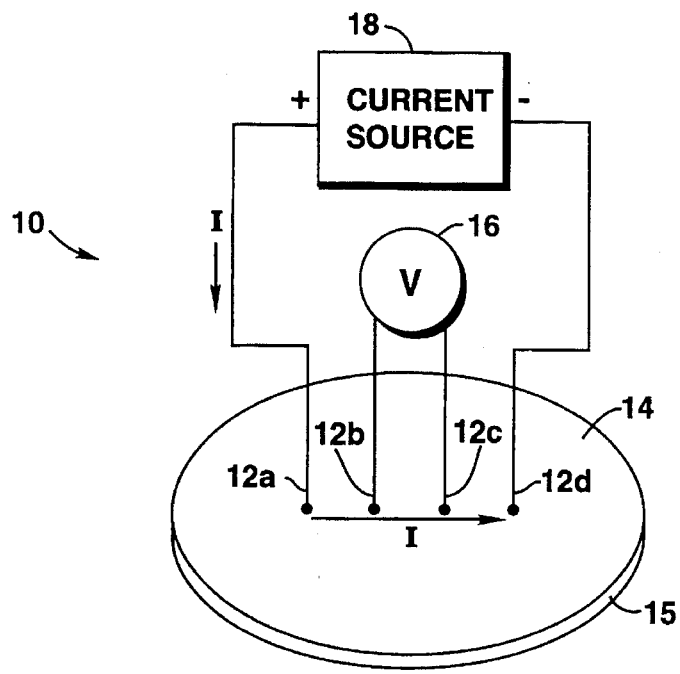
FIG. 1 is a schematic view of a prior art four point probe.
Figure 2:
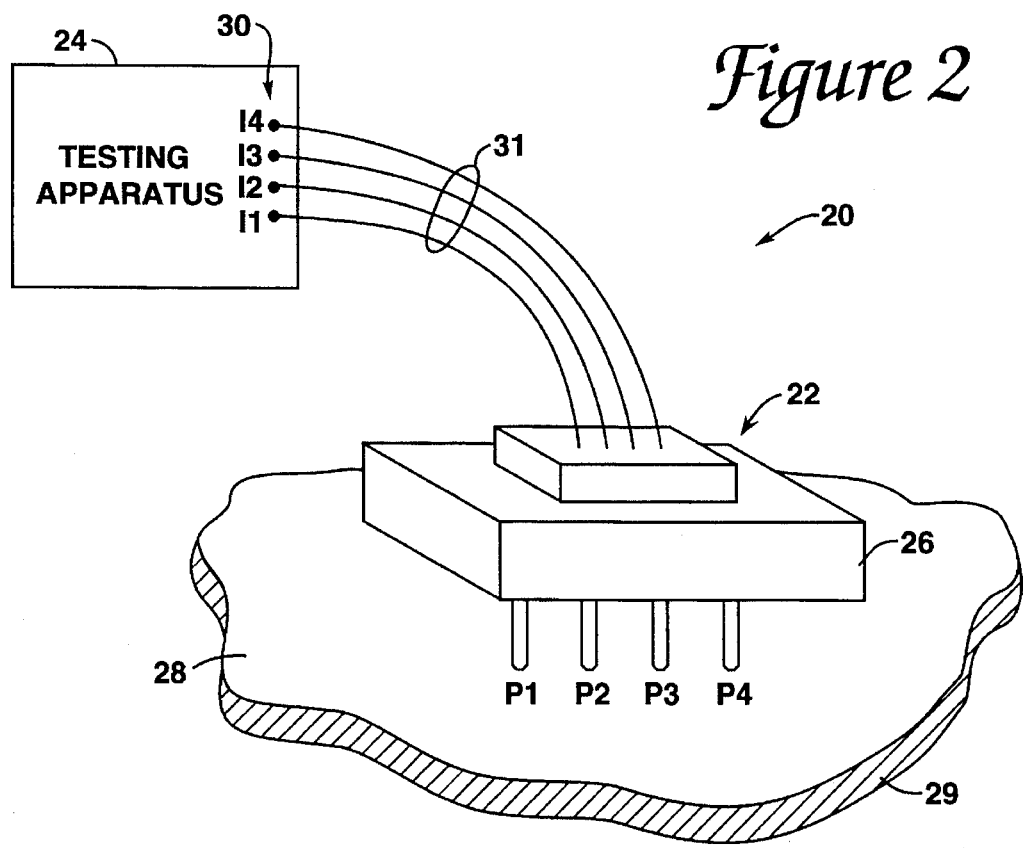
FIG. 2 is a perspective view of a four point probe connected to a measurement apparatus.

A prior art four point probe measurement system was shown in FIG. 1. In FIG. 2, an apparatus for measuring film thickness 20 is shown for the present invention. Apparatus 20 comprises a test probe assembly 22 and a testing apparatus 24. The assembly 22 comprises test probes P1, P2, P3 and P4 that extend from a housing 26, i.e., there are four test probes in the preferred embodiment, aligned in the standard four-point probe configuration. The test probes P1–4 are preferably spring biased to prevent damage to the film and substrate. The test probes P1–4 engage a film surface 28 on a substrate 29. The film is most typically a metal film such as aluminum (Al), tungsten (W), or a metal alloy such as titanium nitride (TIN), titanium tungsten (TiW), tungsten silicide (WSi), or doped silicon. The springs connecting the probes to the housing allow the probes to shift vertically and thus prevent the probes from marking or damaging the film surface 28 when they contact the film and provide a good contact between each of the probes and the film surface. Each probe P1–4 is connected to a terminal I1, I2, I3, or I4 (I1–4) of the probe assembly connections 30, located on the testing apparatus 24 (described below); where probe P1 is connected to terminal I1, probe P2 is connected to terminal I2, probe P3 is connected to terminal I3, and probe P4 is connected to terminal I4. The connection is made through insulated wires 31.

Figure 3:
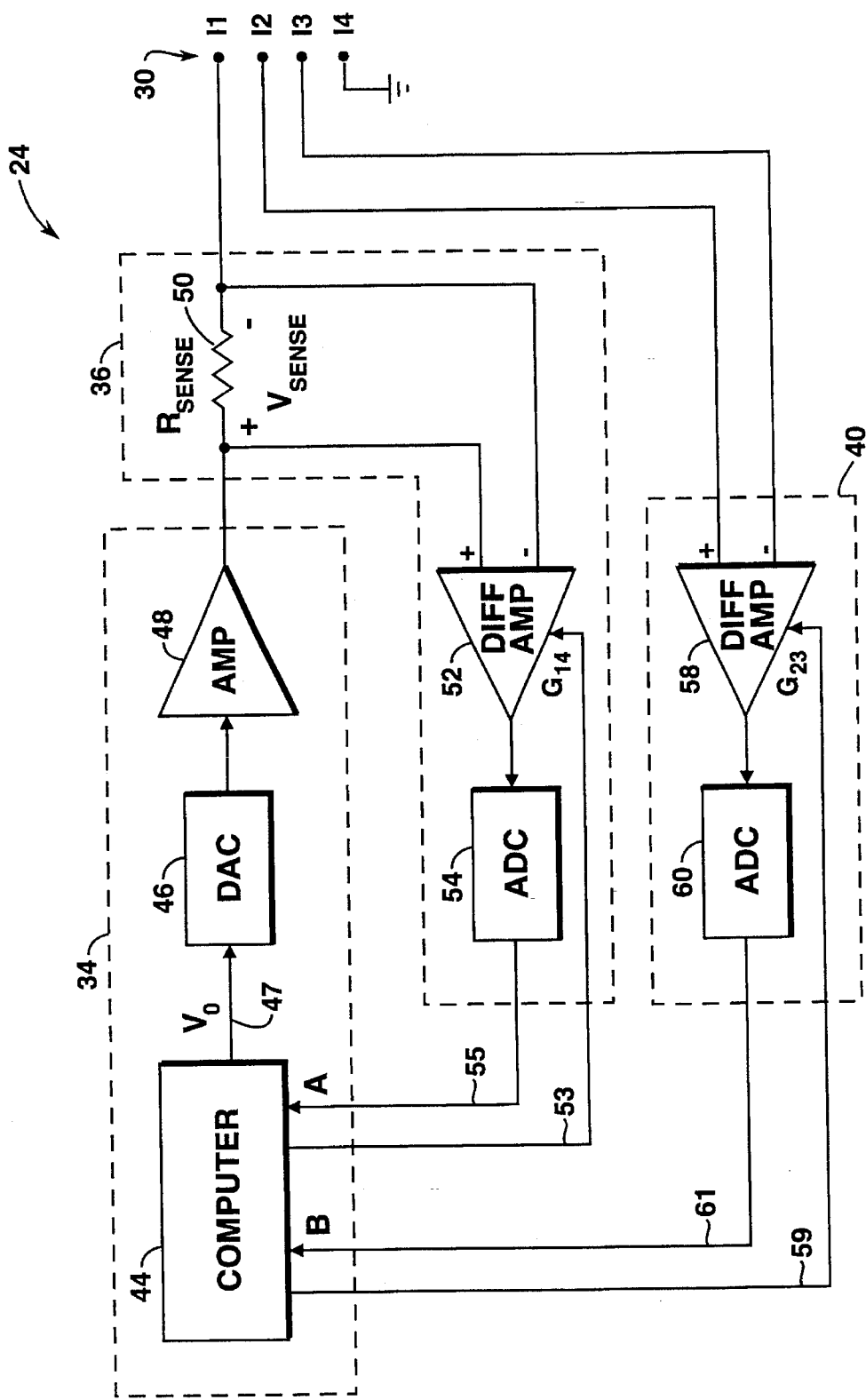
FIG. 3 is schematic diagram of a measurement apparatus.

FIG. 3 shows a testing apparatus 24 to measure the sheet resistance and thickness of a film. The preferred embodiment of the testing apparatus 24 comprises a voltage source 34, probe assembly connections 30, a current sensing means 36, and a voltage sensing means 40.

The voltage source 24 includes a digital computer 44, a digital to analog converter (DAC) 46, and an amplifier 48. The digital computer 44 is a programmable device including a microprocessor and an output interface. A suitable digital computer is an AT class IBM compatible personal computer. The computer is coupled to a DAC 46 by a parallel bus 47. In the preferred embodiment, the bus comprises twelve parallel lines, so that the range of binary numbers received by the DAC is 0 to $2^{12}-1=4095$; a 16-bit or higher resolution DAC can also be used. The computer is programmed to send signals to the DAC that are within the range of $-5$ to $+5$ volts. The DAC 46 is thus able to output 4096 different voltage levels ranging from $-5$ volts to $+5$ volts. A suitable DAC 46 is made by Analog Devices and has a part number AD7237.

The input of amplifier 48 is coupled to the output of DAC 46. Amplifier 48 preferably has a high gain and thus a high output current. A high current is needed to flow through the film 28 so that the voltage across the inner probes P2 and P3 is large enough to be measured accurately. The amplifier 48 in the preferred embodiment outputs a voltage that ranges from $-35$ to $+35$ volts. This voltage is the output voltage of the voltage source 34. A suitable amplifier 48 is made by Burr Brown and has a part number OPA541.

The probe assembly connections 30 comprise terminals I1– I4. The terminals are connected to the probes P1–P4, respectively, of the probe assembly 22, as described above, and terminal I1 is also coupled to the output of the voltage source 34 by a sense resistor as explained below. The voltage produced by source 34 flows through the sense resistor, through probe P1, through the film 28, through probe P4, and to ground at terminal I4. Terminals I2 and I3 are connected to probes P2 and P3, respectively, to measure a voltage across the film. In an alternative arrangement, the voltage flows through the sense resistor, through probe P1, through the film 28, through probe P3, and to a ground connection at terminal I3. In this alternative arrangement, the voltage is sensed by probes P2 and P4, connected to terminals I2 and I4, respectively, and the voltage sensing means 40 (described below) is connected to terminals I2 and I4 instead of terminals I2 and I3.

Voltage source 34 is coupled to terminal I1 by a current sensing means 36, which includes a sense resistor 50, a differential amplifier 52, and an analog-to-digital converter (ADC) 54. Sense resistor 50 is coupled between the output of the voltage source 34 and the terminal I1, as explained above. The value for the sense resistor 50 can vary between 10 to 10,000 ohms; the value is adjusted to optimize the sensitivity of the measurements and varies for different films with different resistivities. The sense resistance and gain of the differential amplifier 52 (see below) allow measurements to have a dynamic range of $10^{12}$ to 1.

Differential amplifier 52 measures the voltage $V_{sense}$ across the sense resistor 50. The differential amplifier in the preferred embodiment is an Analog Devices AD524 or equivalent amplifier. The two input terminals of the differential amplifier are each coupled to one terminal of the sense resistor. Differential amplifier 52 measures $V_{sense}$ across the sense resistor 50 and outputs a voltage adjusted according to the variable gain $G_{14}$ of the differential amplifier 52. The gain $G_{14}$ can be set to different levels by the computer 44 by sending a control signal on control line 53 to set gain tabs on the differential amplifier 52. In the preferred embodiment, gain $G_{14}$ can be set at 1, 10, 100 or 1000. The gain is set to maximize the range of the ADC 54.

The output of the differential amplifier 52 is coupled to an analog-to-digital converter (ADC) 54. The ADC in the preferred embodiment is an Analog Devices AD574. The ADC 54 inputs a range of voltages and has a resolution of twelve bits; a higher resolution ADC can also be used. A range of binary signals from 0 to 4096 can be sent on the twelve bit bus 55 coupled to the output of the ADC. The bus 55 is coupled to an input port of a digital computer; the digital computer 44 of the voltage source 34 is preferably used. The computer receives data over the bus 55, which is the signal A representing the sense voltage $V_{sense}$ across the sense resistor 50. The computer calculates the current $I_{sense}$ through the sense resistor by dividing the sense voltage $V_{sense}$ by the known sense resistance value $R_{sense}$. $I_{sense}$ is equal to the current flowing through the outer probes and the film.

Voltage sensing means 40 comprises a differential amplifier 58 and an ADC 60. The differential amplifier 58 in the preferred embodiment is an Analog Devices AD524 or equivalent amplifier. The differential amplifier 58 has two input leads which are coupled to the terminals I2 and I3, respectively, of the probe assembly connections 30. Terminals I2 and I3 are coupled to probes P2 and P3, respectively, of the probe assembly 22. Differential amplifier 58 senses the voltage $V_{23}$ across terminals I2 and I3 and outputs a voltage adjusted according to the variable gain $G_{23}$ of the differential amplifier 58. The gain $G_{23}$ can be set to different levels by by the computer 44 by sending a control signal on control line 59 to set gain tabs on the differential amplifier 58. In the preferred embodiment, gain $G_{23}$ can be set at 1, 10, 100, or 1000. The gain should be set to maximize the range of the ADC 60.

The output of the differential amplifier 48 is coupled to an ADC 60. Similar to the ADC 54 of the current sensing means 36, the ADC 60 has a resolution of twelve bits, so that a digital binary output from 0 to 4095 can be sent on a twelve bit bus 61 coupled to the output of the ADC 60. The bus 61 is coupled to an input port of the digital computer 44. The computer receives the data from the ADC over bus 61; the data is the digital signal B representing the voltage across probes P2 and P3 on the film surface 28.

Preferably DAC 46, amplifier 48, differential amplifiers 48 and 52, and ADC's 54 and 60 are provided on a plug-in board for computer 44. Alternatively, the DAC 46 and the ADC 60 are provided on a plug-in board for computer 44 and the amplifiers are externally provided near the probe assembly 22.

Figure 4:
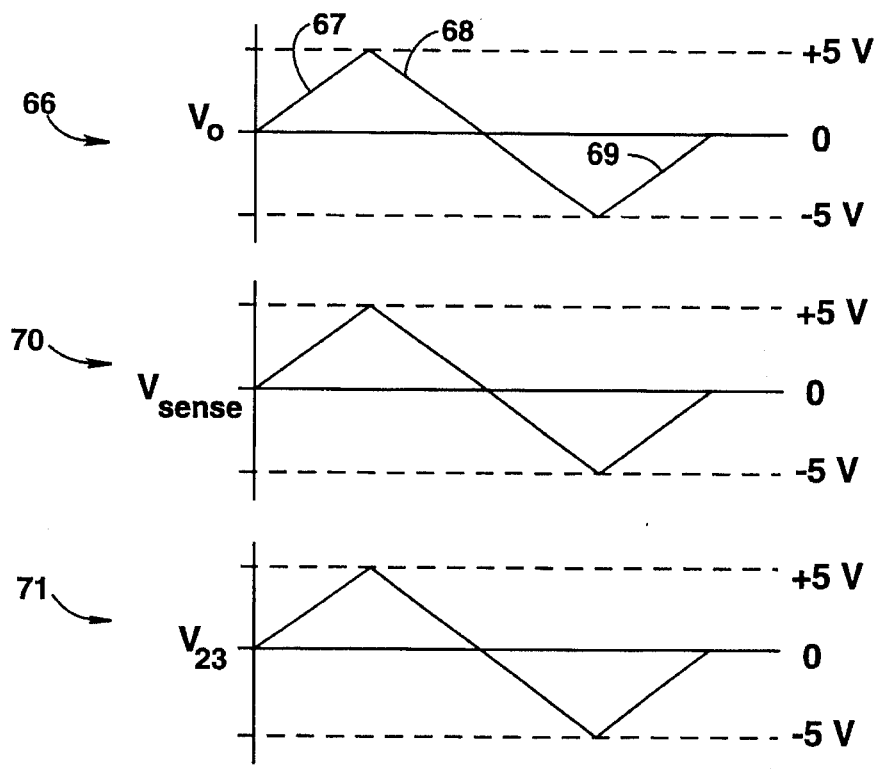
FIG. 4 is graph of the output sawtooth waveform and the corresponding sense voltage and probe voltage waveforms.

FIG. 4 shows graphs of the voltage waveforms used in this preferred embodiment of the present invention. The graph 66 of $V_o$ shows the time-variant sawtooth-shaped waveform generated by the voltage source 34 and varying from −5 volts to +5 volts. Each cycle of the sawtooth-shaped waveform comprises an upwardly-sloping ramp 67, a downwardly-sloping ramp 68, and another upwardly-sloping ramp 69. The sawtooth-shaped waveform has the advantage of being substantially continuous, thereby avoiding any sudden jumps in current that may cause hysteresis effects in the measurements. The sawtooth-shaped waveform of $V_o$ includes a number of voltage steps, each step corresponding to a number preferably between 0 and 4095 output by the computer 34. The sawtooth-shaped waveform is thus made up of 2048 steps in the upward-sloping ramp 67, 4096 steps in the downward-sloping ramp 68, and 2048 steps in the upwardly-sloping ramp 69. The graph 70 of $V_{sense}$ and the graph 71 of $V_{23}$ (i.e. the voltage across probes P2 and P3) show the same sawtooth-shaped voltage waveform shown in the $V_o$ graph. This relationship shows that the current across the sense resistor and the voltage across the probes P2 and P3 vary substantially in phase with the source voltage, so that for each point in the $V_o$ waveform, a corresponding $V_{sense}$ and $V_{23}$ call be measured.

Figure 5:
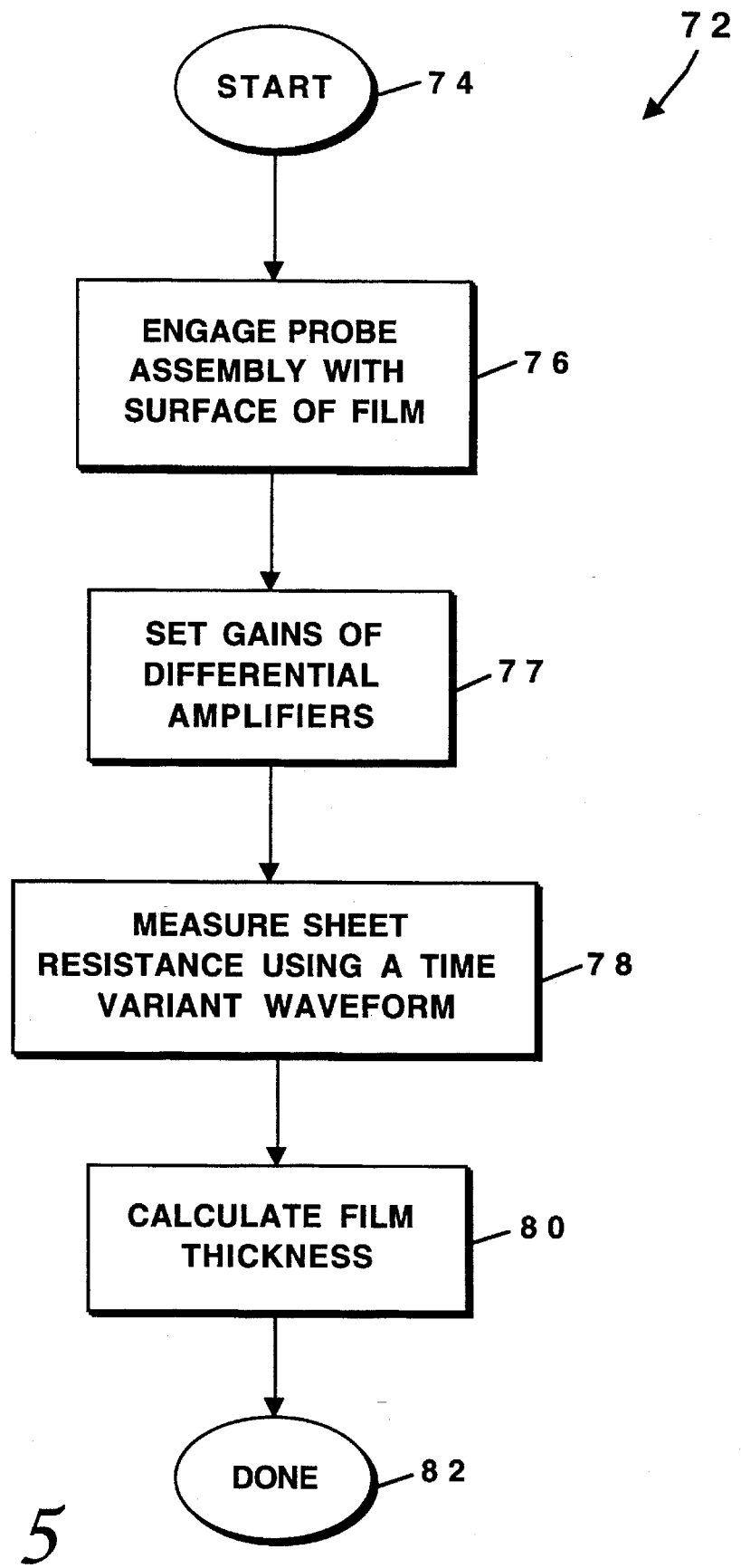
FIG. 5 is a flow diagram of a method to calculate film thickness.

FIG. 5 is a flow diagram of a method 72 of measuring film thickness. The method begins at step 74, and, in a step 76, the probe assembly is engaged with a surface of the film which is to be measured for thickness. The film is made of a conductive material that allows a current to flow. The most typical application is the measurement of the thickness of metal films deposited on semiconductor wafers.

The probe assembly 22 is brought into contact with the surface 28 of the film so that all of the probes P1-4 are touching the surface. This can be done by moving either the probe assembly 22 or the substrate 29. The probes P1-4 are preferably spring-loaded so that they relieve pressure on the film surface when initially brought in contact with the surface, and so that they all make good contact with the film.

In a step 77, the measuring system is calibrated. The goal of the calibration is to adjust the measured voltages $V_{sense}$ and $V_{23}$ so that they are within the voltage range of the ADCs 54 and 60. The variable gains $G_{14}$ and $G_{23}$ of the differential amplifiers 52 and 58 are set by the computer 44 by control lines 53 and 59, respectively. To correctly set the gains, the computer outputs a voltage $V_o$, which is approximately 1 or 2 volts in the preferred embodiment, and receives an initial measurement from signals A and B from the four point probe assembly 22 so that the range of the measured voltages $V_{sense}$ and $V_{23}$ is known. The computer 44 then sets the gains $G_{14}$ and $G_{23}$ with the control lines 53 and 59 so that the output of the differential amplifiers 52 and 58 is in the range of the ADCs 54 and 60.

In a step 78, the process of measuring the sheet resistance of the surface of the film is described. A time-variant waveform $V_o$ is sent by the voltage source 34 to the probe assembly 22 to create a current through the film. This current creates a voltage between the inner probes P2 and P3. The voltages $V_{sense}$ and $V_{23}$ are measured by the differential amplifiers and a sheet resistance is calculated by a digital computer for the film. The process is described in detail subsequently.

In a step 80, a digital computer calculates the film thickness, which is calculated using the formula:

$$\text{Thickness(cm)} = \frac{\rho}{R_{sheet}}$$

where ρ, the resistivity of the film in ohm-cm, is a known value for the film material. $R_{sheet}$ is the sheet resistance, which is the resistance value calculated in step 78 from the measured voltages $V_{sense}$ and $V_{23}$. There are several methods to compute film thickness. The method in the preferred embodiment is to calculate a film thickness from the $R_{sheet}$ value calculated in step 78 from a least squares line fit. Another method is to calculate a film thickness for each measured $R_{sheet}$ value stored in step 78 and then average the film thicknesses. A third method is to calculate the film thickness from an average $R_{sheet}$ value calculated in step 78. After the film thickness is calculated, the method is completed as indicated in step 82.

Figure 6:
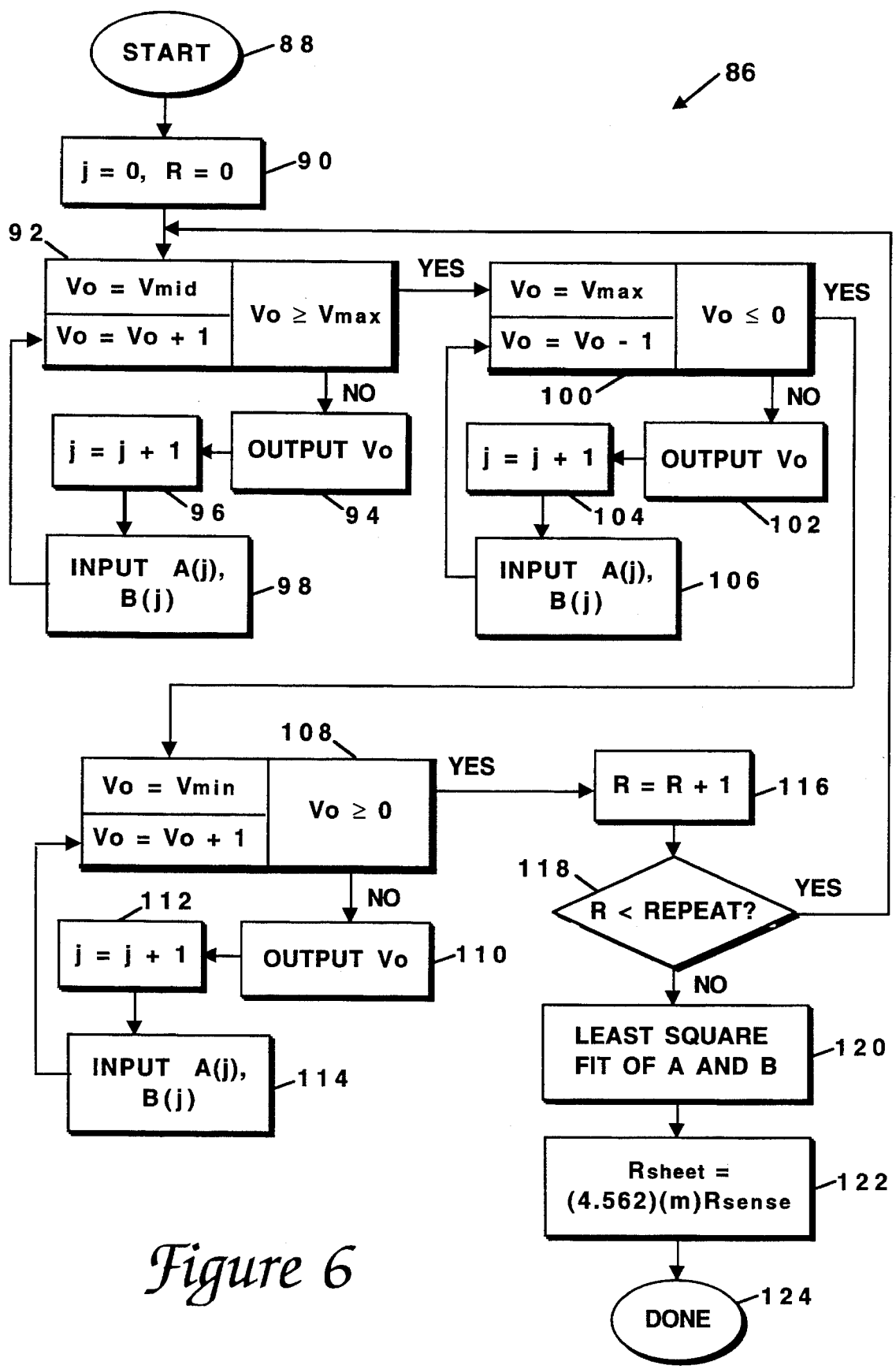
FIG. 6 is a flow diagram of a method to measure sheet resistance using a time variant waveform.

FIG. 6 is a flow diagram of the method 86 of measuring sheet resistance of a film, shown in step 78 of FIG. 5. The method starts with step 88 and, in step 90, counter variables j and R are initialized to zero. In a step 92, voltage $V_o$ from the voltage source 34 is set to zero volts, which is equal to the number 2048 on a scale from 0 to 4095 in the preferred embodiment. Vo is compared to the maximum level $V_{max}$ of $V_o$, which is the number 4095. If $V_o$ is greater than or equal to $V_{max}$, then the upward ramp 67 of the sawtooth is complete, and the next step is step 100, described below. If $V_o$ is less than $V_{max}$, then $V_o$ is output on bus 47 by the voltage source 24 in a step 94. Index variable j is incremented in step 96, and input signals A and B are read in and stored as subscripted variables A(j) and B(j) in step 98. Signals A and B represent the voltages $V_{sense}$ and $V_{23}$, respectively, read by the differential amplifiers 52 and 58. Once the values of signals A and B are stored in step 98, then $V_o$ is incremented by the computer in step 92 and compared again to $V_{max}$. Until $V_o$ reaches the maximum voltage, the computer increments $V_o$, outputs $V_o$, and stores the signals A and B measured at that $V_o$ value. Once the voltage $V_o$ is at the maximum level, the first ramp 67 of the sawtooth waveform is complete and step 100 is initiated.

Step 100 begins the downwardly-sloping ramp 68 of the sawtooth waveform as seen in FIG. 4. $V_o$ is set at the maximum voltage $V_{max}$, corresponding to the number 4095 in the preferred embodiment. $V_o$ is compared to zero; if it is less than or equal to zero, the ramping is complete, and the next step is 108 (described below). If $V_o$ is greater than zero, then voltage source 24 outputs $V_o$ on bus 47 in a step 102. Index variable j is incremented in step 104, and input signals A and B are read as subscripted variables A(j) and B(j) in step 106. Signals A and B represent the voltages $V_{sense}$ and $V_{23}$, respectively, read by the differential amplifiers 52 and 58. The values of signals A and B are stored in step 106, and the value of $V_o$ is decremented in step 100. The loop continues in the same manner so that $V_o$ is outputted on bus 47 each time it is decremented and signals A and B are read and stored in the computer for each level of $V_o$. When $V_o$ reaches −5 volts (the number 0), the downwardly-sloping ramp 68 is complete and step 108 is initiated.

Step 108 begins the final upwardly-sloping ramp 69 of the $V_o$ waveform cycle as seen in FIG. 4. $V_o$ is set at the minimum voltage $V_{min}$ corresponding to the number 0 in the preferred embodiment. $V_o$ is compared to $V_{mid}$ (equal to 2048); if it is greater than or equal to $V_{mid}$, the ramping is complete, and step 116 is initiated. If $V_o$ is less than zero, then $V_o$ is output and signals A and B are measured and stored by the computer in a similar fashion as described for steps 92–98 above. When $V_o$ reaches 0 volts (the number 2048), the upwardly-sloping ramp is complete and step 116 is initiated.

The voltage source 34 can vary the voltage $V_o$ very quickly, and thus many voltage measurements A and B are taken in a given time period. Since a voltage is being varied, no delay time for allowing a current level to stabilize in a current source is necessary.

Steps 116 and 118 are optional. In a step 116, variable R is incremented. R stores the count of cycles that the voltage $V_o$ has cycled through. A cycle has occurred each time the voltage $V_o$ is incremented through an upwardly-sloping ramp and decremented through a downwardly-sloping ramp. Each cycle preferably consists of 8192 levels of $V_o$, so that there are 8192 different sets of stored A and B data. Alternatively, every other level of Vo can be ignored so that 4096 sets of data are measured.

In a step 118, the variable R is compared to the REPEAT variable. The REPEAT variable contains the number of cycles that the user wishes the voltage $V_o$ to cycle through. Thus, in the preferred embodiment, REPEAT multiplied by 8192 equals the total number of different measurements taken on the film surface. If R is less than REPEAT in step 118, another cycle of the $V_o$ waveform is initiated at step 92. If R is greater than REPEAT, step 120 is initiated. In the preferred embodiment, one cycle of the voltage waveform is always used for any film, resulting in 8192 measurements (or 4096 if every other step in the waveform is ignored). In this case, REPEAT is always set to 1, and steps 116 and 118 are not required.

The value of the sheet resistance of the film $R_{sheet}$ is calculated next using a least square line fit of the measurement voltage values stored in the previous steps. In step 120, a least square line fit is calculated from the data points of stored values A(j) and B(j) (see FIG. 7). As explained above, there are up to 8192 data points stored in the preferred embodiment. The method for generating a least square line fit with existing data is well-known in the art. $R_{sheet}$ is proportional to the slope m of the least square line. The equation describing the least square line is:

$$V_{23} = V_{23\ hu\ 0} + mV_{sense}$$

Ignoring $V_{23}^o$, which contains DC offsets of the entire electronic system, the slope m is equal to:

$$\text{slope} = m = \frac{V_{23}}{V_{sense}}$$

$R_{sheet}$ is calculated from the known equation:

$$R_{sheet} = 4.562 \frac{V_{23}}{I_{sense}} = 4.562 \frac{V_{23}}{V_{sense}} R_{sense}$$
$$= 4.562\ mR_{sense}$$

where $I_{sense}$ is the current flowing through the film, $R_{sense}$ is the known resistance of the sense resistor 50, and $V_{sense}$ is the voltage across the sense resistor. $V_{sense}$ and $V_{23}$ are stored in the computer as values A(j) and B(j), respectively. $R_{sheet}$ is calculated using the known formula 4.562(V/I) that assumes the four probes of the probe assembly 22 are spaced equally apart. In step 122, the computer multiplies the factor 4.562, the slope of the least square line, and the resistance of the sense resistor 50 to get $R_{sheet}$ for the tested film. Once the $R_{sheet}$ value is calculated, the process is complete, as indicated in step 124.

Other methods can be used to calculate a sheet resistance $R_{sheet}$ from the measurement data, such as an averaging method. An $R_{sheet}$ value can be calculated for each set of A and B data. All the $R_{sheet}$ values can then be added together and divided by the total number of measurements taken to get the average $R_{sheet}$ value. The least square line fit method is used in the present embodiment, since it is insensitive to offsets in circuit components, as described in FIG. 7.

Using the above-described process, more measurements can be taken in a given time period. With a greatly increased amount of measurements, the accuracy of the calculations for sheet resistance and film thickness are also greatly increased.

Figure 7:
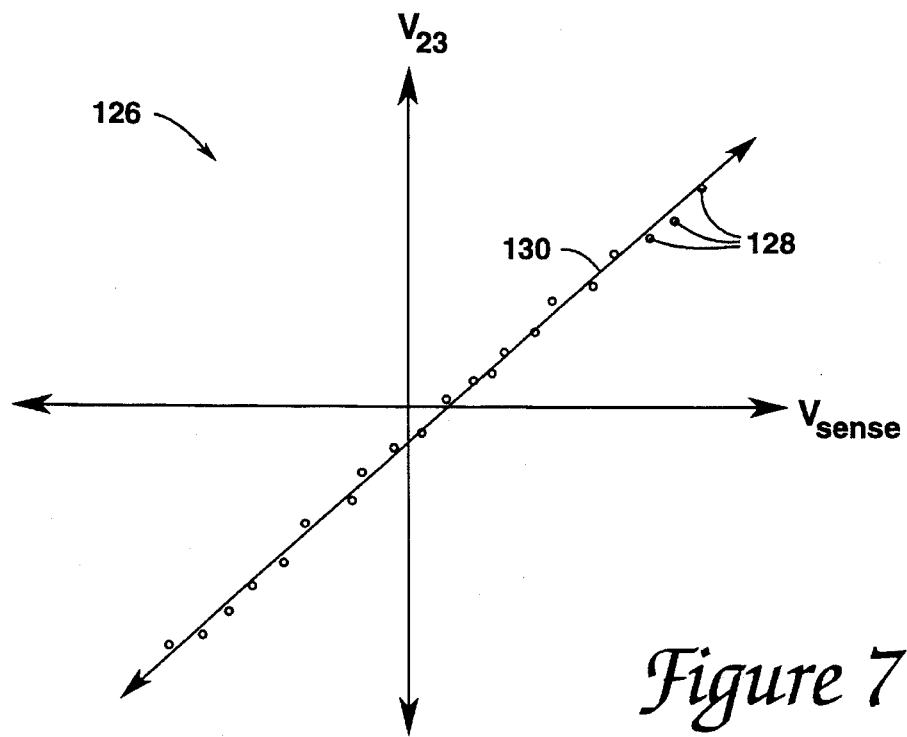
FIG. 7 is a graph of measurements of the sense voltage vs. the voltage across the inner probes of the four-point probe.

FIG. 7 is a graph 126 showing the measurement points 128 of the voltages $V_{23}$ and $V_{sense}$ and the least squares line 130 calculated from the measurement points 128. The measurement points 128 are approximately linear, so that if a single measurement is much different from the other measurements, that measurement point 128 in graph 126 is spaced far from the least squares line 130 and is thus easy to single out.

As described above, $R_{sheet}$ is proportional to the slope of the least square line 130, and the slope of the line 130 is calculated in order to determine the value of $R_{sheet}$. Since a slope is measured, undesired offsets in the voltage source 34 or other electronic components in the system do not affect the accuracy of the $R_{sheet}$ measurement. Line 130 may cross the origin of the axes of graph 126, indicating no offset in the differential amplifiers, or the line may cross the axes at a different point as shown in FIG. 7, indicating that an offset exists in the system. This offset, however, does not affect the accuracy of the resistance measurement.

In using a sawtooth-shaped waveform as the voltage source, the measurement points are taken when $V_{23}$ and $V_{sense}$ are either both negative or both positive, and the measurement points 128 appear in the first and third quadrants of the graph. This has the effect of reducing hysteresis effects, such as magnetic effects, that occur on the film surface when a current is induced in the film. Also, the sawtooth-shaped waveform is a substantially continuous waveform and thereby avoids any large jumps in voltage and current that could occur from discontinuities. Such discontinuities can cause hysteresis effects in the film. By taking measurements with a continuous sawtooth-shaped waveform in the first and third quadrants of the graph of FIG. 7, one effectively degausses the measurement.

While this invention has been described in terms of several preferred embodiments, it is contemplated that alterations, modifications and permutations thereof will become apparent to those skilled in the art upon a reading of the specification and study of the drawings. It is intended that the claims include all such alterations, modifications and permutations as fall within the spirit and scope of the present invention.

What is claimed is:

1. A method for measuring sheet resistance of a film surface comprising:

engaging a probe assembly including a plurality of probes with a surface of a film;

coupling a voltage waveform generator to said probe assembly to create a variable voltage and thereby create a variable current through a portion of said film;

measuring said variable current flowing through said portion of said film at a plurality of points in time;

measuring said variable voltage between two of said probes at a corresponding plurality of points in time; and calculating a sheet resistance of said film from a plurality of ratios of said measured voltages to corresponding measured currents.

2. A method as recited in claim 1 wherein said current flows between a first pair of probes and said voltage is sensed between a second pair of probes.

3. A method as recited in claim 1 further comprising engaging said probe assembly with a surface of a film at a plurality of locations on the film surface and calculating a sheet resistance for each location thus engaged.

4. A method as recited in claim 1 wherein said waveform generator creates a cyclical current in said film.

5. A method as recited in claim 4 wherein said waveform comprises a sawtooth.

6. A method as recited in claim 1 wherein said waveform generator includes a digital computer.

7. A method as recited in claim 1 further comprising measuring said current flowing through said film and said voltage between two of said probes at a plurality of points in time.

8. A method as recited in claim 1 wherein said step of measuring said current flowing through said film includes coupling a sensing resistor between said waveform generator and said probe assembly, and measuring a voltage across said sensing resistor.

9. A method as recited in claim 8 further comprising the step of adjusting the maximum amplitude of said waveform generator such that said voltage across said sensing resistor has a predetermined maximum sensing voltage.

10. A method for measuring thickness of a film comprising:

engaging a probe assembly including a plurality of probes with a surface of a film;

applying a first arbitrary voltage from a variable voltage source at a first time to said probe assembly to create a first arbitrary current through a portion of said film;

measuring said first current through said portion of said film at said first time;

measuring a first voltage between two of said probes at said first time;

applying a second arbitrary voltage from said voltage source at a second time to said probe assembly to create a second arbitrary current through said portion of said film, wherein said second arbitrary voltage is different from said first arbitrary voltage and said second arbitrary current is different from said first arbitrary current;

measuring said second current through said portion of said film at said second time;

measuring a second voltage between two of said probes at said second time;

calculating a sheet resistance from the ratio of said first voltage to said first current and said second voltage to said second current; and calculating film thickness from the ratio of a known resistivity of said film to said sheet resistance.

11. A method as recited in claim 10 further comprising engaging said probe assembly with a surface of a film at a plurality of locations on the film surface and calculating a sheet resistance for each location thus engaged.

12. A method as recited in claim 10 wherein said step of applying an arbitrary voltage to said probe assembly includes the step of applying a substantially sawtooth-shaped voltage waveform.

13. A method as recited in claim 10 wherein said step of measuring said current includes the step of measuring a voltage across a known resistance through which said current flows.

14. An apparatus for measuring film thickness comprising:

a probe assembly including four probes;

a current sensor;

a variable voltage source coupled to said probe assembly by said current sensor to create a variable voltage, thereby creating a variable current in a film when said probe assembly is engaged with a surface of said film;

a voltage sensor coupled to said probe assembly to sense a voltage between two probes of said probe assembly; and a device for determining film thickness from said measured current and said measured voltage.

15. An apparatus for measuring film thickness as recited in claim 14 wherein said current sensor includes a sense resistor between said voltage source and one of said probes.

16. An apparatus for measuring film thickness as recited in claim 15 wherein said current sensor includes a voltage sensor for sensing a voltage across said sense resistor.

17. An apparatus for measuring film thickness as recited in claim 14 wherein said voltage source provides at least two different voltage levels at two different points in time.

18. An apparatus for measuring film thickness as recited in claim 17 wherein said current in said film and said voltage between two probes are sensed at both of said two points in time.

19. An apparatus for measuring film thickness as recited in claim 14 wherein said voltage source provides a substantially sawtooth-shaped waveform.

20. An apparatus for measuring film thickness as recited in claim 14 wherein said voltage source includes a digital processing apparatus, said voltage source providing a voltage waveform comprising numerous voltage steps, wherein said voltage sensor senses a voltage at a plurality of said steps.

21. An apparatus for measuring film thickness as recited in claim 20 wherein said voltage source includes a digital to analog (D/A) converter coupled to an output of said digital processing apparatus.

22. An apparatus for measuring film thickness as recited in claim 20 wherein said voltage source includes an amplifier coupled to an output of said D/A converter.

23. An apparatus for measuring film thickness as recited in claim 14 wherein said current sensor includes a sense resistor, a differential amplifier having its inputs coupled across said sense resistor, analog to digital (A/D) converter coupled to an output of said differential amplifier, and a digital processor having an input coupled to an output of said A/D converter.

24. An apparatus for measuring film thickness as recited in claim 14 wherein said voltage sensor includes a differential amplifier having its inputs coupled to said two probes of said probe assembly, analog to digital (A/D) converter coupled to an output of said differential amplifier, and a digital processor having an input coupled to an output of said A/D converter.

25. A method as recited in claim 1 wherein said step of calculating a sheet resistance of said film from a plurality of ratios of said measured voltages to corresponding measured currents includes performing a least squares fit of said ratios.

* * * * *